US006985551B1

(12) United States Patent
Mattisson et al.

(10) Patent No.: US 6,985,551 B1
(45) Date of Patent: Jan. 10, 2006

(54) LINEAR DEAD-BAND-FREE DIGITAL PHASE DETECTION

(75) Inventors: Sven Mattisson, Bjärred (SE); Hans Hagberg, Malmö (SE); Magnus Nilsson, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 864 days.

(21) Appl. No.: 09/580,632

(22) Filed: May 30, 2000

(51) Int. Cl.
*H03D 3/24* (2006.01)

(52) U.S. Cl. ........................ 375/376; 375/371; 375/373

(58) Field of Classification Search ........ 375/371–376; 327/2, 157, 12, 3, 23; 331/1 A, 25, 11
See application file for complete search history.

(56) References Cited

U.S. PATENT DOCUMENTS 4,818,950 A * 4/1989 Ranger ........................ 327/157
5,103,191 A * 4/1992 Werker ........................ 331/1 A
5,631,582 A 5/1997 Fujikawa
6,002,273 A * 12/1999 Humphreys .................... 327/3
6,049,233 A * 4/2000 Shurboff ........................ 327/2

FOREIGN PATENT DOCUMENTS

EP 0 458 269 A1 11/1991

OTHER PUBLICATIONS

D. P. Turner: "Phase Locked Loop Phase Adjustment" IBM Technical Disclosure Bulletin, US, IBM Corp. New York, vol. 15, No. 7, Dec. 1972, pp. 2080-2081.*

* cited by examiner

*Primary Examiner*—Stephen Chin
*Assistant Examiner*—Curtis Odom
(74) *Attorney, Agent, or Firm*—Potomac Patent Group PLLC

(57) ABSTRACT

A phase-locked loop includes a phase detector, a loop filter, a voltage controlled oscillator and a frequency divider arranged such that the phase detector generates a phase detector output signal as a function of a phase difference between the reference clock signal and the feedback signal; the loop filter generates a frequency control signal from the phase detector output signal; the voltage controlled oscillator generates a phase-locked loop output signal that has a frequency that is controlled by the frequency control signal; and the frequency divider generates the feedback signal from the phase-locked loop output signal. The phase-locked loop further includes one or more circuit elements that maintain an operating point of the phase detector such that, for a predetermined range of both positive and negative phase differences between the reference clock signal and the feedback signal, the output signal is generated as a substantially linear function of the phase difference between the reference clock signal and the feedback signal.

22 Claims, 14 Drawing Sheets

200

1225

LINEAR DEAD-BAND-FREE DIGITAL PHASE DETECTION

BACKGROUND

The present invention relates frequency synthesizers and direct modulation, more particularly to phase locked loops, and even more particularly to digital phase detectors for use in a phase locked loop.

Phase locked loops (PLLs) are well known, and are useful for generating oscillating signals in many types of circuits, including but not limited to radio circuitry. In digital communication systems, for example in mobile telephone communications operating under the GSM or DCS systems, PLLs may be employed to effect continuous phase modulation (CPM) of a carrier signal.

FIG. 1 is a block diagram of a conventional integer-divide PLL 100. A phase detector 101 compares the phase of a signal supplied by a reference oscillator 103 with the phase of a feedback signal supplied by a frequency divider 105. The output of the phase detector, which represents the phase difference between the two input signals, is filtered by a filter 107. The filtered output is then used to control the frequency of an output signal generated by a voltage controlled oscillator (VDO) 109. The output signal from the VCO 109, in addition to being supplied as an output from the PLL, is also supplied as an input to the frequency divider 105, and is thus the source of the feedback source. The PLL 100 is governed by the following equations:

$$i_e = K_P\left(\phi_R - \frac{\phi_o}{N}\right) \tag{1}$$

$$\phi_o = i_e Z(s)\frac{K_V}{s},$$

where s, Kp, Z(s), and $K_V$ are the complex frequency, phase detector gain, loop-filter trans-impedance, and VCO gain, respectively, and $\phi_R$, $\phi_0$, and $i_e$, are the reference phase (or frequency as $2\pi f=s*\phi$), the VCO phase, and the phase-determined error current, respectively.

Solving the above equations for $\phi_o$ yields the well-known result that $\theta_o=N\cdot f_R$, that is, the VCO frequency is an integer multiple of the reference frequency.

Since the loop response time to a change in N (e.g., when a new channel is selected) is proportional to $1/f_R$ (i.e., it takes a certain number of reference cycles to settle) and the minimum channel spacing equals $f_R$, there is a conflict in the choice of reference frequency. That is, it would be desirable to set a low value for $f_R$ to reduce the minimum channel spacing. However, such a setting would result in a larger loop response time, which is undesirable.

To get around the above restriction on channel spacing, fractional-N PLLs have been devised. By employing a variable-modulus divider, rather than an integer divider, it is possible to achieve more flexible divide ratios. For example, performing three successive divisions by 20 followed by one division by 21 results in an average division factor of $(3\cdot 20+21)/4=20.25$ and a channel spacing of $f_R/4$. Due to the repetitive nature of this variable modulus division, however, spurious tones will be generated (here at $f_o\pm n\cdot f_R$) that will modulate the VCO.

Recently, ΔΣ modulators have been employed to shape the spurious response of the fractional-N divider. A graph depicting a typical ΔΣ noise density distribution is depicted in FIG. 2. The spurious tone is replaced by a spectrum of spurious tones with most of the spurious energy pushed out in frequency, well beyond the bandwidth of the PLL, essentially being centered around $f_R/2$, where $f_R$ is the clocking rate of the ΔΣ modulator. A thermal noise floor (e.g., thermal noise attributable to the divider circuitry) is also included. As a result of the shaping performed by the ΔΣ modulator, this spurious energy will have a substantially reduced effect on the output signal from the PLL.

An exemplary embodiment of a ΔΣ fractional-N PLL 200 is depicted in FIG. 3. The phase detector 201, reference oscillator 203, filter 207 and VCO 209 are analogous to those counterpart elements described with respect to FIG. 1, and therefore need not be described here in detail. The frequency divider 205 in this case is capable of dividing by any integer modulus in the range N±M, and has two inputs: one for receiving a value for N, and another for receiving a value of M. By appropriately varying the value of M as described above, an effective division modulus of N+δN can be achieved. A ΔΣ modulator 211 is provided that receives a desired channel value, and generates therefrom appropriate values for N and M. In the exemplary embodiment, a first-order ΔΣ modulator is shown, but this is not essential.

The ΔΣ noise will be suppressed by the loop response (i.e., if the loop bandwidth is not too wide), but to avoid spurious tones due to ΔΣ-modulator limit cycles (i.e., a repetitive behavior associated with having a period time that is too short), extra noise ("dither") is typically added to further randomize the ΔΣ noise. This is modeled in FIG. 3 by the summing circuits 213 that adds a dither value to the ΔΣ noise. The resultant value is then quantized, which adds its own quantization noise, $e_q(k)$. The resultant value M, which is generated at the output of the ΔΣ modulator 211, is supplied to one of the modulus inputs of the frequency divider 205.

To make the noise shaping possible, the divider modulus should not be chosen to be only the two closest integer factors, but should instead be varied between, for example, N−M, . . . , N+M. This extra modulus range is required if noise is to be pushed out in frequency, away from the VCO carrier; otherwise, the loop filter will not be able to suppress the ΔΣ noise. As a consequence of this extended divider modulus range, the instantaneous phase error will be increased. The ΔΣ-loop equations then become:

$$i_e = K_P\left(\phi_R - \frac{\phi_o}{N+\delta N} + N_{\Delta\Sigma}\right) \tag{2}$$

$$\phi_o = i_e Z(s)\frac{K_V}{s},$$

where N+δN and $N_{\Delta\Sigma}$ represent the fractional division ratio and the ΔΣ-modulator noise, respectively. FIG. 4 is a graph that illustrates the output spectrum of the frequency divider 205.

FIG. 5 is a block diagram of a typical embodiment of the conventional phase detector 201. The use of first and second digital latches 501, 503 enables multiple states (not shown in FIG. 5) and, hence, an extended range of the phase detector 201. In operation, the first latch 501 controls whether a first charge pump 505 is on or off. Similarly, the second latch 503 controls whether the second charge pump 507 is on or off. The first and second charge pumps 505, 507 are connected in series, with the phase detector output current, $i_e$, being supplied at the connection point between the two charge pumps. The amount of phase detector output current, $i_e$, is related to whether none, one, or both of the first and second charge pumps 505, 507 are turned on. The amount of time that $i_e$ is one-zero is a function of the phase difference between the two input signals, $\phi_a$ and $\phi_b$. Each of these signals is supplied to a clock input of a respective one of the first and second latches 501, 503. The first of these signals to present a clocking edge causes the output of the corresponding latch to be asserted, which in turn, causes a corresponding one of the first and second charge pumps 505, 507 to turn on. When the clocking edge of the remaining input signal is subsequently asserted, it too causes the output of its corresponding latch to be asserted. The outputs of both the first and second latches 501, 503 are further supplied to respective inputs of a logical AND gate 509, whose output is supplied to the RESET inputs of both the first and second latches 501, 503. Consequently, when the outputs of both latches 501, 503 are asserted, the output of the AND gate 509 will be asserted as well, thereby resetting both latches 501, 503. They are now initialized to repeat the process again for a next cycle. As a result, the output current $i_e$ is either a positive value (being supplied by the first charge pump 505) if the first input signal $\phi_a$ leads the second input signal $\phi_b$, or else it is a negative value (being drawn by the second charge pump 507) if the second input signal $\phi_b$ leads the first input signal $\phi_a$.

A typical phase-detector transfer function is depicted in FIG. 6, in which the average phase detector output current, $i_{e\_avg}$, is plotted as a function of phase difference, $\Delta\phi$. Not shown in FIG. 6 is a "dead-zone" that would be associated with the phase detector depicted in FIG. 5. The dead-zone, and ways of dealing with it, are discussed in greater detail below.

The phase detector output is often designed with charge pumps having a high-impedance off state. This high-impedance off state effectively turns the loop filter into an integrator (i.e., if the trans-impedance Z(s) is capacitive). A simplified rendition of a charge pump tat may be used as either of the charge pumps 505, 507 is shown in FIG. 7. In this simplified design, the current for the "down" stage is drawn by transistor 707 when the "down" signal 709 is asserted. The current for the "up" stage is supplied by the current mirror arrangement of transistors 701, 703 and 705 when the "up" signal 711 is asserted.

Referring back to FIGS. 3 and 5, when the PLL 201 is properly tracking its reference, $\phi_R$, both of the phase-detector latches 501, 503 trigger almost simultaneously, due to the fact that the phase difference between the two input signals becomes very small. The reset signal immediately resets the first and second latches 501, 503 and, as a consequence, only short spikes appear at the latch outputs, too fast to turn on the respective first and second charge pumps 505, 507.

In fact, even when there is a small phase error (i.e., a tracking error), the first and second latches 501, 503 will reset too fast for the charge pumps 505, 507 to react. Consequently, the phase-detector transfer function will be characterized by a small dead-band (low-gain region) around the origin. A common technique to combat this dead-band is to utilize a delay circuit 801, which adds a delay $\delta T$ to the reset signal, as illustrated in FIG. 8. With this extra delay, the up and down pulses will each be long enough to activate the charge pumps, thereby eliminating the dead-band.

Despite the use of the delay circuit 801 as described above, the $\Delta\Sigma$-based fractional-N PLLs reported in the literature often have inferior noise performance compared to their integer-divide counterparts. This has prevented their use in demanding applications, like cellular phones. The origin of this excess noise has conventionally been attributed to the $\Delta\Sigma$-modulator noise, even though, as shown in FIG. 2, the noise can be made to fall outside the loop bandwidth.

Consequently, it is desirable to provide components and techniques for improving the noise performance of fractional-N PLLs.

SUMMARY

It should be emphasized that the terms "comprises" and "comprising" when used in this specification, are taken to specify the presence of stated features, integers, steps or components; but the use of these terms does not preclude the presence or addition of one or more other features, integers, steps, components or groups thereof.

In accordance with one aspect of the present invention, the foregoing and other objects are achieved in a phase detector that comprises a first input that receives a first signal; a second input that receives a second signal; a comparison circuit that generates an output signal as a function of a phase difference between the first signal and the second signal. The output signal may be in the form of an output current, or alternatively an output voltage. In order to provide linear performance during steady-state operation, the phase detector further comprises an operating point circuit that maintains an operating point of the phase detector such that for a predetermined range of both positive and negative phase differences between the first and second signals, the output signal is generated as a substantially linear function of the phase difference between the first and second signals.

The operating point circuit may assume any of a number of alternative embodiments. For example, where the phase detector is employed in a phase-locked loop, whereby an output frequency of the phase-locked loop is a function of the output signal of the phase detector, the operating point circuit may leak a predefined portion of the output signal so as to prevent the leaked output signal from influencing the output frequency of the phase-locked loop.

Alternatively, where the output signal is an output current and the comparison circuit comprises a first circuit that asserts a first charge pump control signal in response to an edge of the first signal; a second circuit that asserts a second charge pump control signal in response to an edge of the second signal; a first charge pump that contributes a positive current to the output current in response to assertion of the first charge pump control signal; a second charge pump that contributes a negative current to the output current in response to assertion of the second charge pump control signal; and reset logic that supplies a reset signal to each of the first and second circuits in response to both of the first and second charge pump control signals being asserted, the operating point circuit may comprise a delay circuit that delays at least one of the first and second charge pump control signals from being supplied to the reset logic, wherein a length of time that it takes the first change pump control signal to be supplied to the reset logic is not equal to the length of time that it takes the second charge pump control signal to be supplied to the reset logic. In this alternative, the delay circuit may be designed to delay only one of the first and second charge pump control signals from being supplied to the reset logic. Alternatively, it may delay both the first and second charge pump control signals from being supplied to the reset logic.

In yet another alternative, where the output signal is an output voltage and the comparison circuit comprises a first circuit that asserts a first voltage generator control signal in response to an edge of the first signal; a second circuit that asserts a second voltage generator control signal in response to an edge of the second signal; a first voltage generator that contributes a positive voltage to the output voltage in response to assertion of the first voltage generator control signal; a second voltage generator that contributes a negative voltage to the output voltage in response to assertion of the second voltage generator control signal; and reset logic that supplies a reset signal to each of the first and second circuits in response to both of the first and second voltage generator control signals being asserted, the operating point circuit may comprise a delay circuit that delays at least one of the first and second voltage generator control signals from being supplied to the reset logic, wherein a length of time that it takes the first voltage generator control signal to be supplied to the reset logic is not equal to the length of time that it takes the second voltage generator control signal to be supplied to the reset logic. In this alternative, the delay circuit may be designed to delay only one of the first and second voltage generator control signals from being supplied to the reset logic. Alternatively, it may delay both the first and second voltage generator control signals from being supplied to the reset logic.

In yet another alternative embodiment in which the phase detector is employed in a phase-locked loop, linear operation of the phase detector may be achieved by including, in the phase-locked loop one or more circuit elements that leak a predefined portion of at least one of a phase detector output signal and a frequency control signal that controls a controllable oscillator circuit (e.g., a voltage controlled oscillator or current controlled oscillator) so as to prevent the leaked output signal from influencing the output frequency of the phase-locked loop. For example, such leakage may be designed to be performed by one or more circuit elements in the loop filter that leak a predefined portion of the phase detector output signal.

BRIEF DESCRIPTION OF THE DRAWINGS

The objects and advantages of the invention will be understood by reading the following detailed description in conjunction with the drawings in which:

FIG. 12(*b*) depicts a linear dead-band-free digital phase detector that is arranged such that a delay circuit is placed at the "down" input of the logical AND gate; and FIG. 12(*c*) depicts a linear dead-band-free digital phase detector that is arranged such that a first delay circuit is placed at the "up" input of the logical AND gate, and a second delay circuit is placed at the "down" input of the logical AND gate.

DETAILED DESCRIPTION

Figure 1:
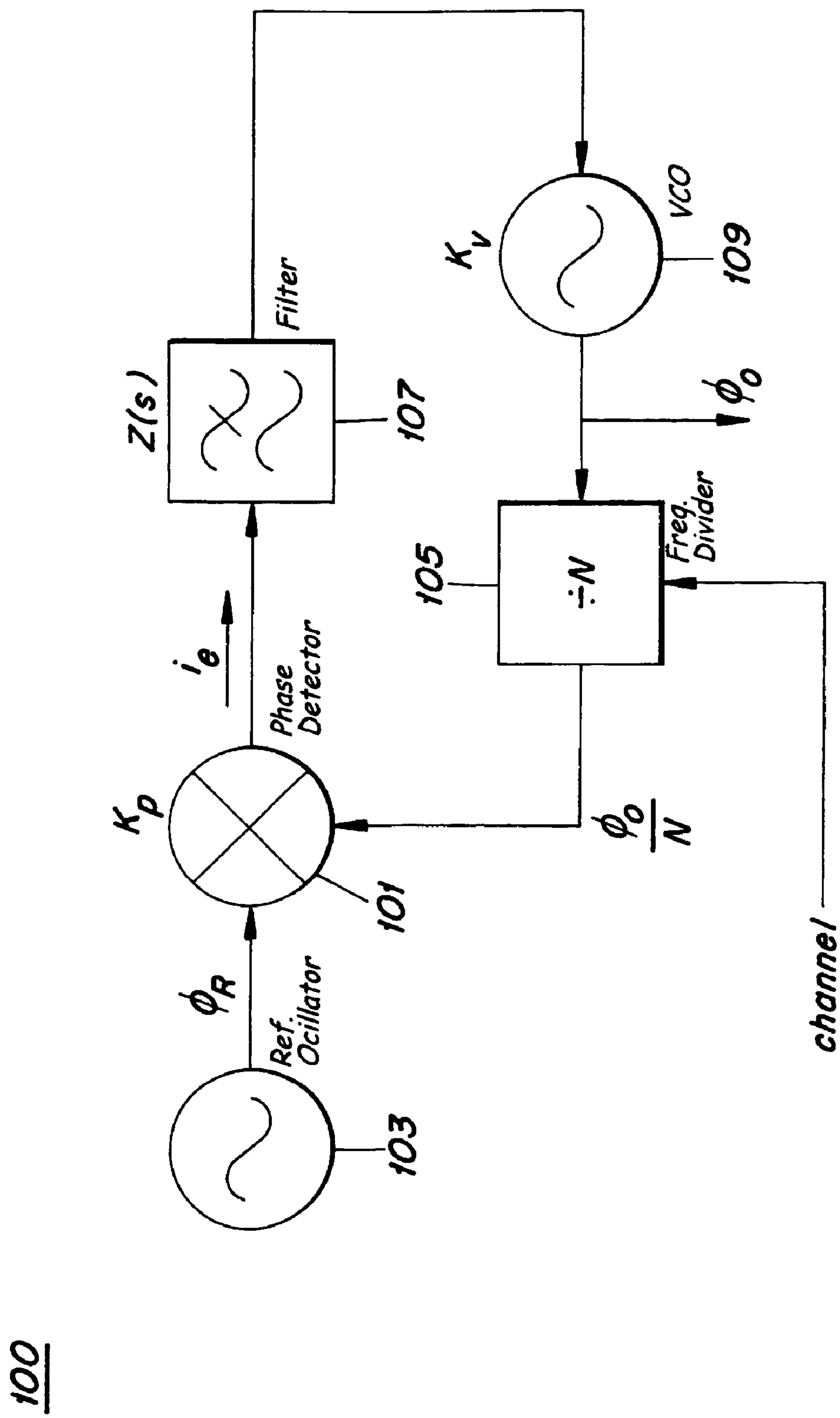
FIG. 1 is a block diagram of a conventional integer-divide phase-locked loop.
Figure 2:
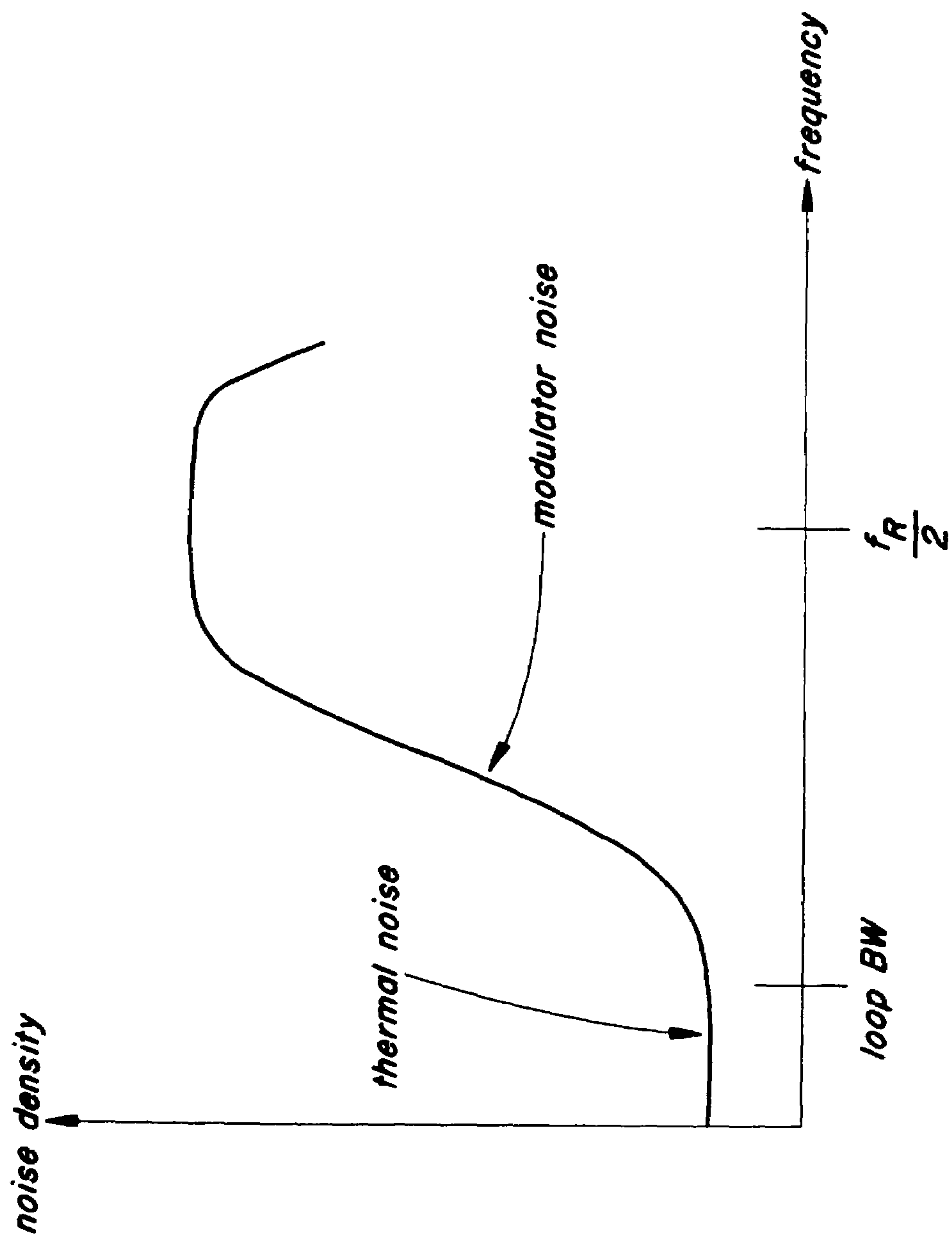
FIG. 2 is a graph depicting a typical ΔΣ noise density distribution.
Figure 3:
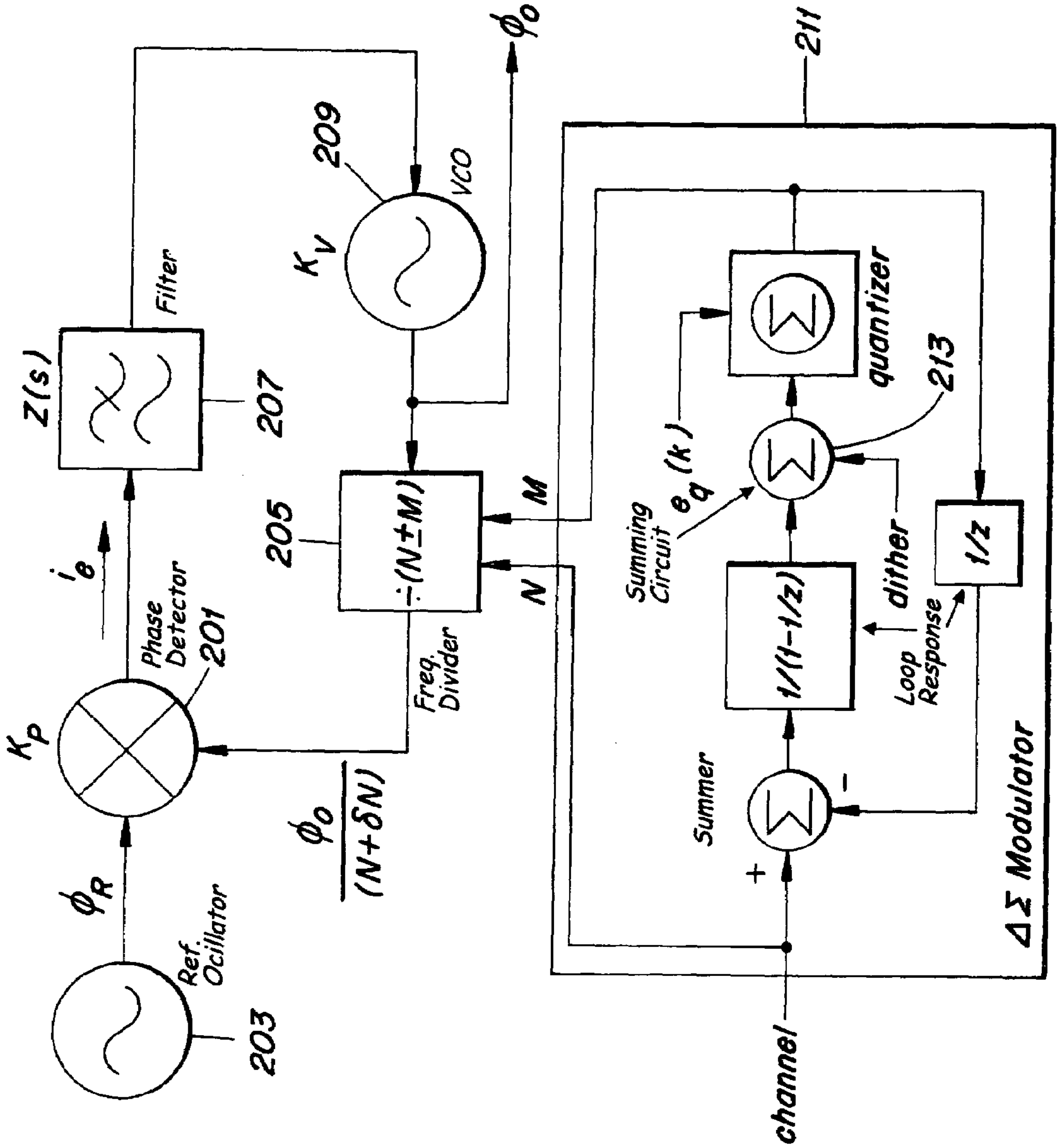
FIG. 3 is a block diagram of an exemplary embodiment of a ΔΣ fractional-N PLL.
Figure 4:
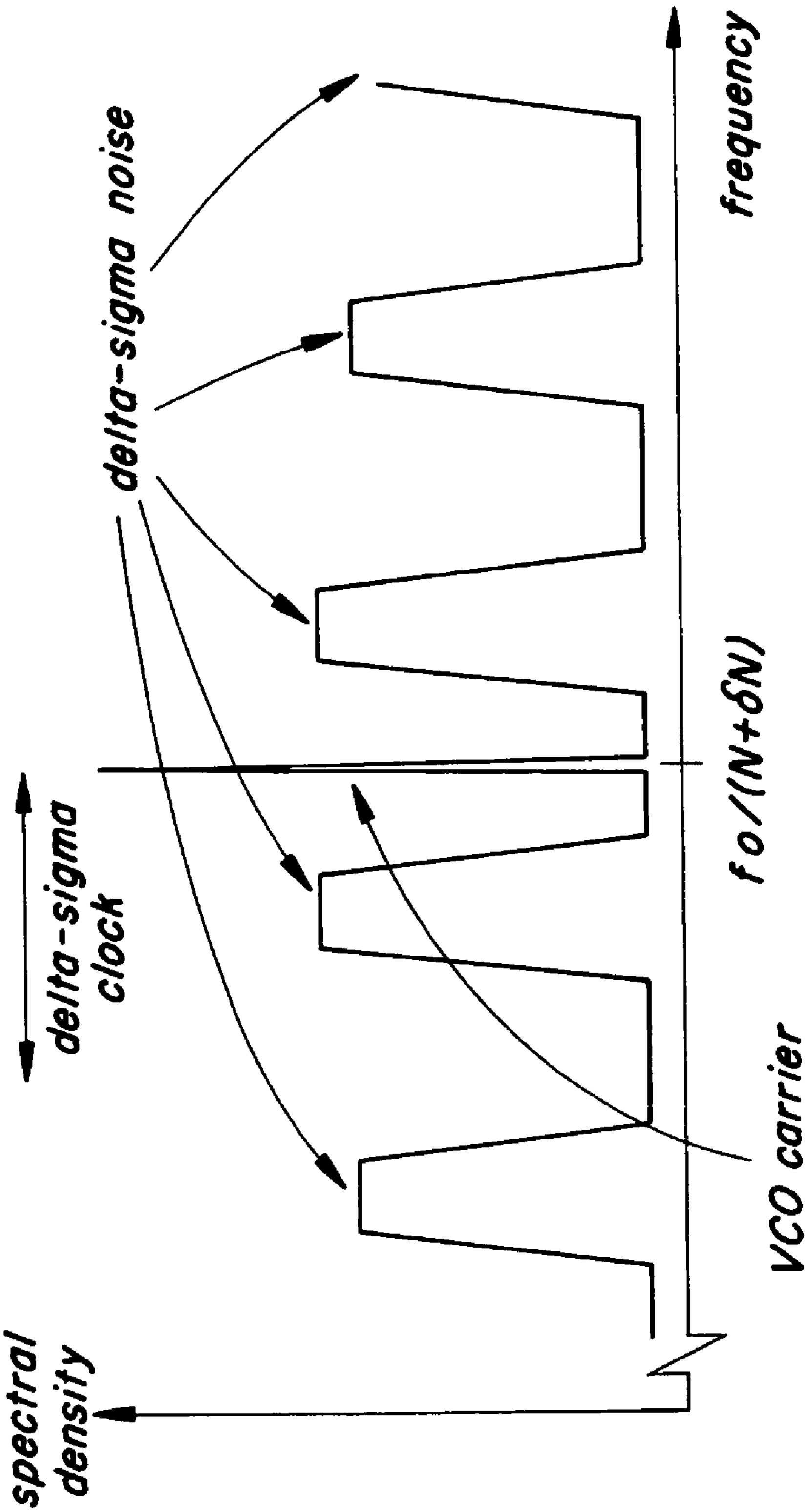
FIG. 4 is a graph that illustrates the output spectrum of a frequency divider.
Figure 5:
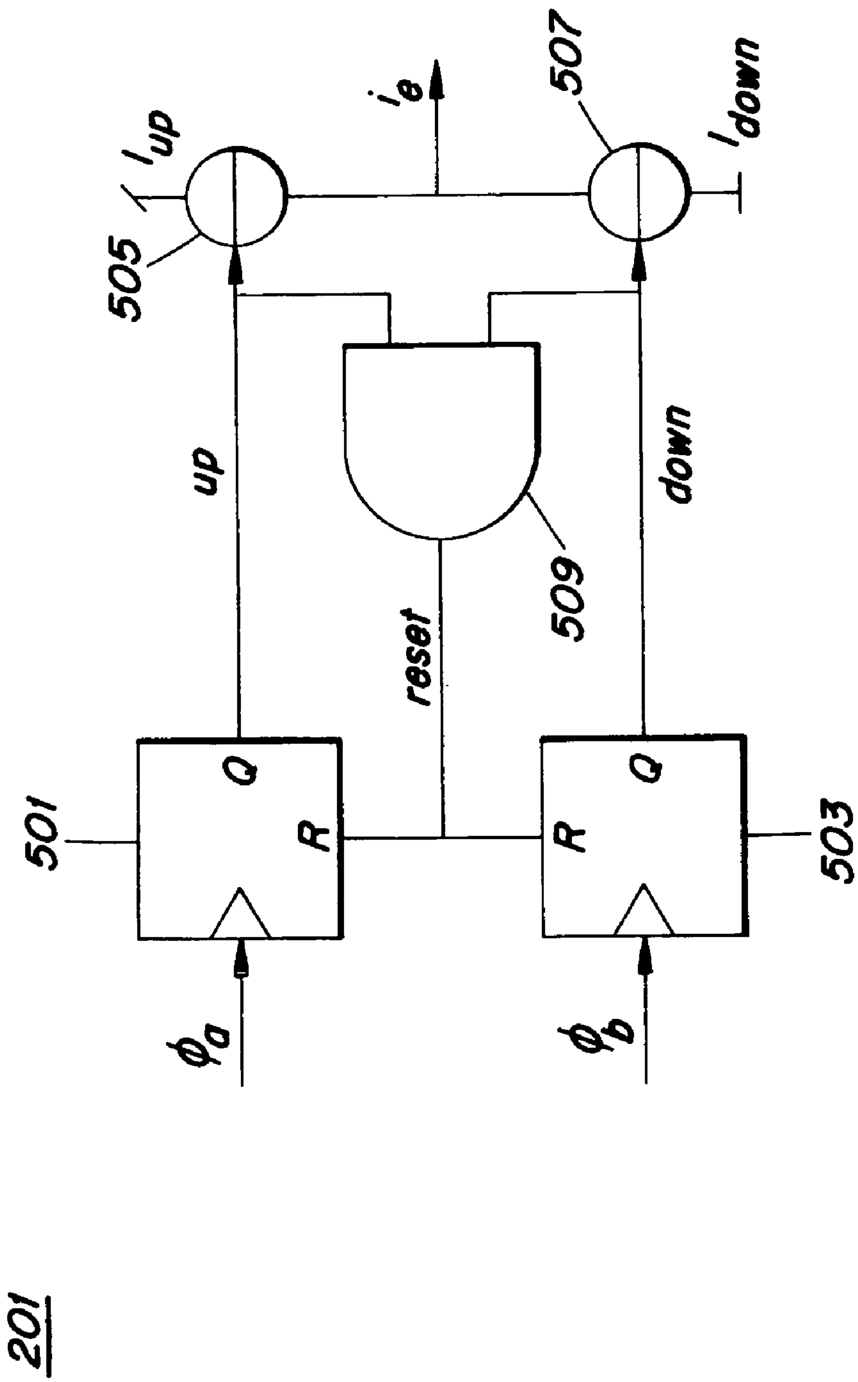
FIG. 5 is a block diagram of a typical embodiment of the conventional phase detector.
Figure 6:
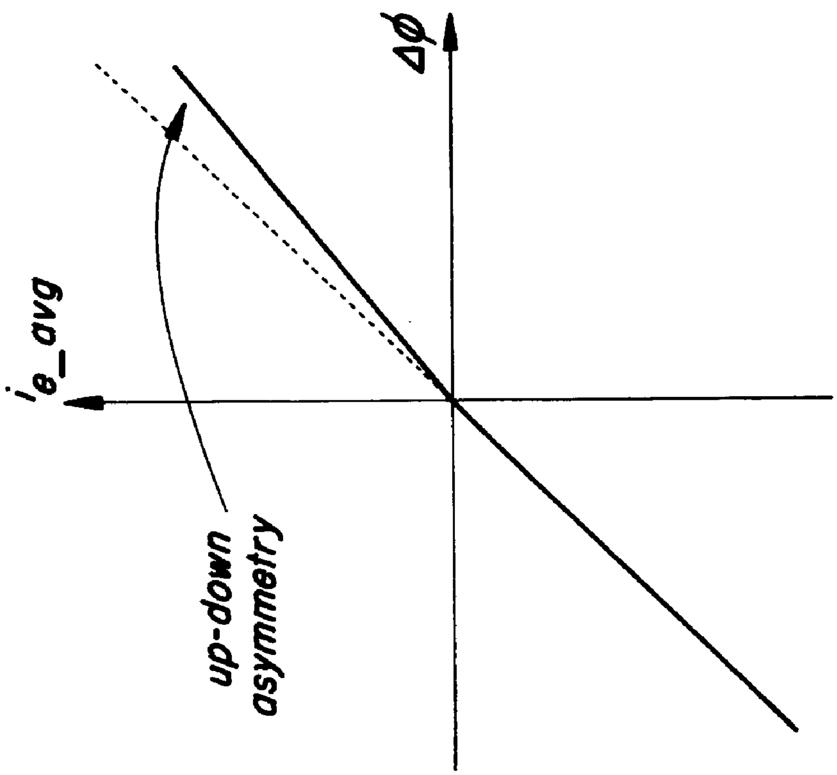
FIG. 6 is a graph of a typical phase-detector transfer function.

The various features of the invention will now be described with respect to the figures, in which like parts are identified with the same reference characters.

Figure 7:
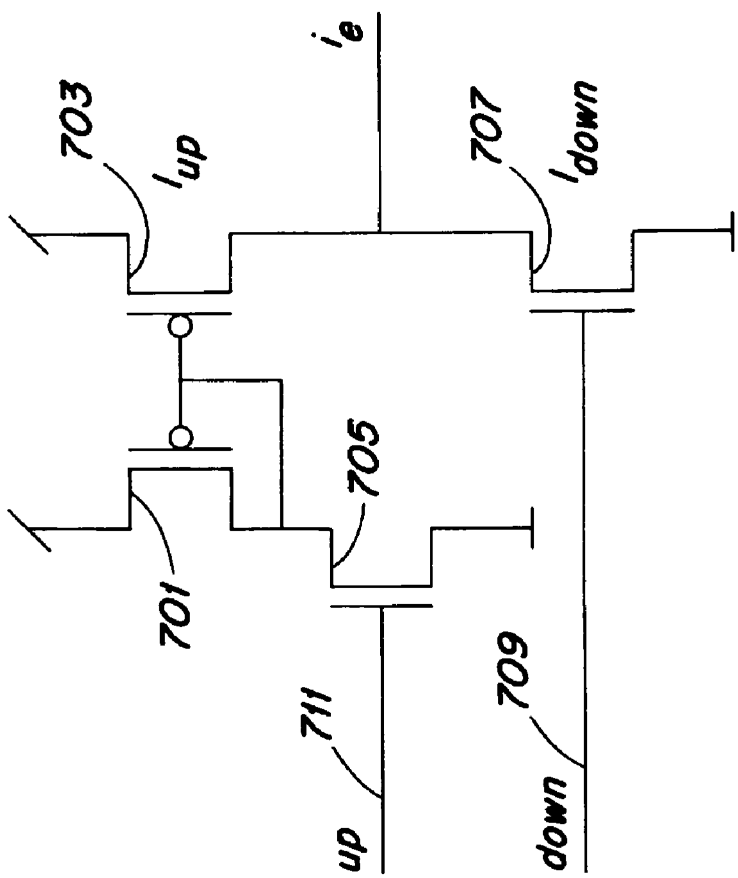
FIG. 7 is a block diagram of a simplified rendition of a charge pump that may be used as either of the charge pumps in a phase detector.
Figure 8:
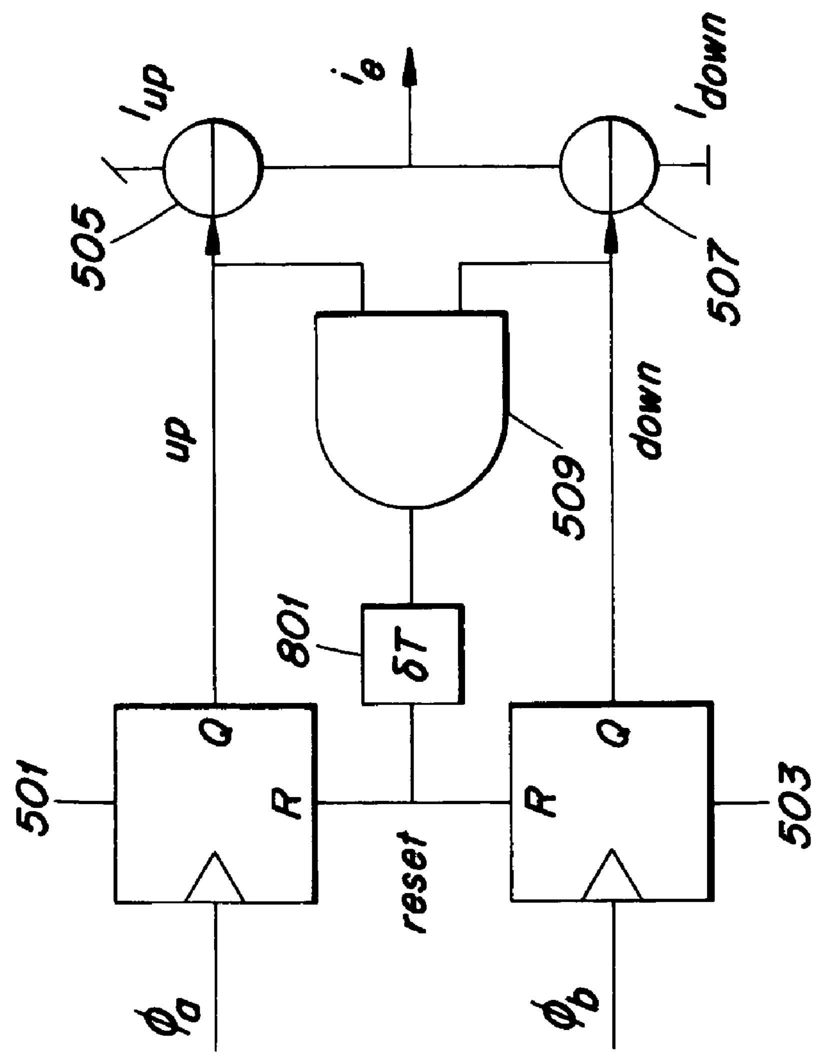
FIG. 8 is a block diagram of a conventional digital phase detector that uses a delay circuit to add a symmetric delay to the reset signal.
Figure 9:
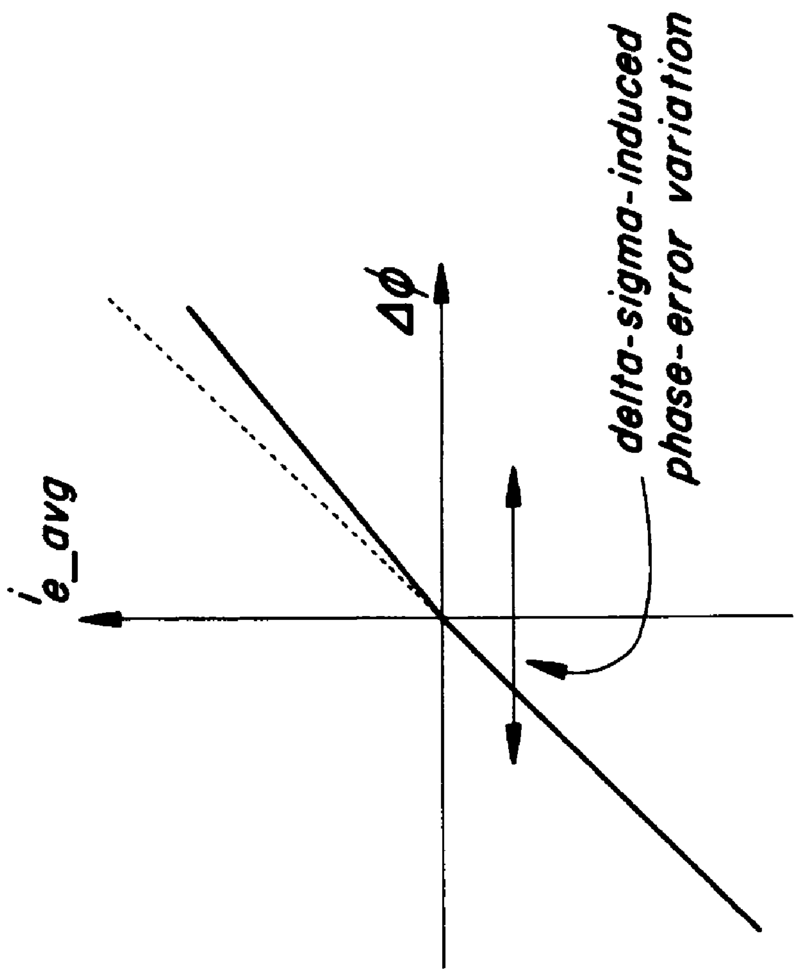
FIG. 9 is a graph of a phase-detector transfer function.
Figure 10:
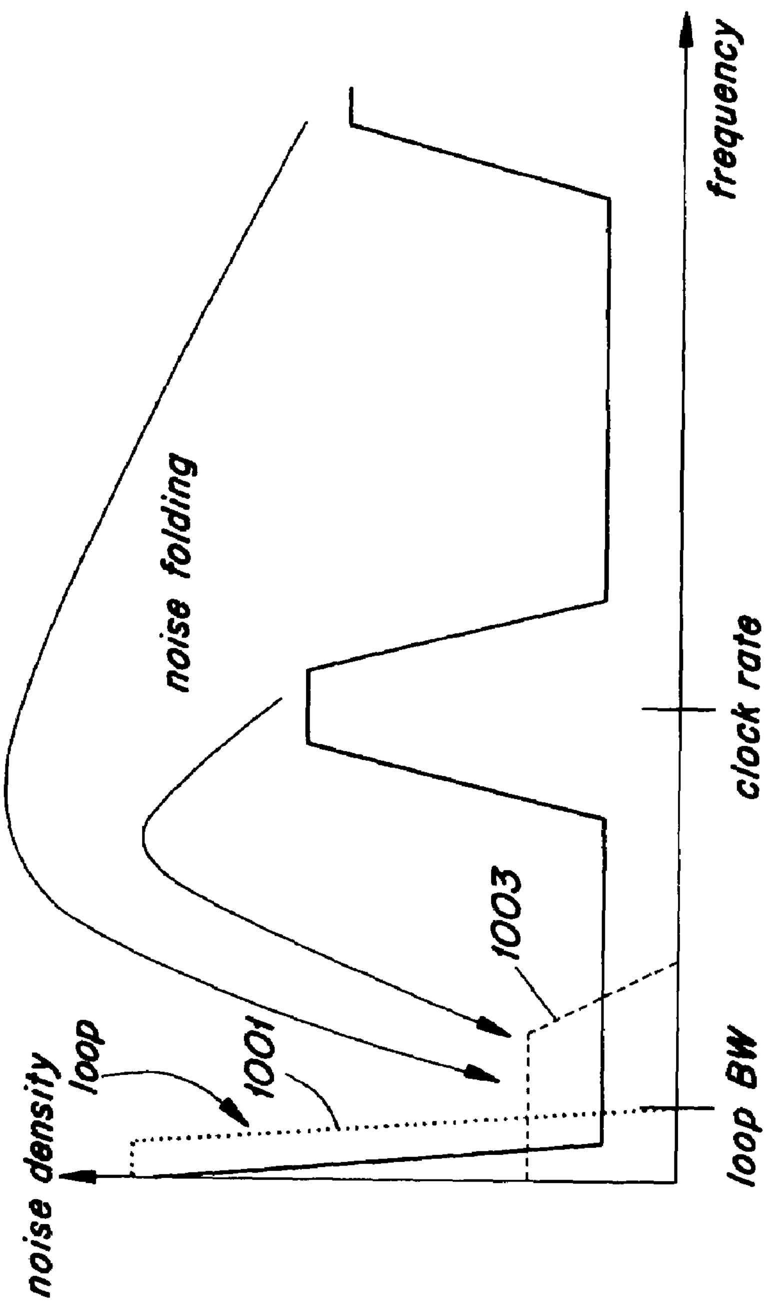
FIG. 10 is a graph of the noise density spectrum at the output of a conventional PLL.

A careful investigation by the present inventors has revealed that, even when the ΔΣ-modulator noise is designed to fall outside the loop passband, a higher-than-expected PLL phase noise is obtained. A further analysis by the present inventors has shown that this excess noise can be attributed to charge-pump asymmetry (e.g., due to transistor mismatches in the charge pump—see, for example, FIG. 7). This asymmetry can be seen in FIG. 9, which shows a graph of a phase-detector transfer function. In particular, it can be seen that the rate of change in the average PLL output current ($i_{e\_avg}$) is different for positive phase differences than it is for negative phase differences. This asymmetry causes a fraction of the ΔΣ-modulator noise to be recited by the charge pump (i.e., an even-order nonlinearity). This nonlinear process centers the rectified ΔΣ-modulator noise around DC (zero frequency) and at twice its bandwidth. This can be seen in FIG. 10, which is a graph of the noise density spectrum at the output of a conventional PLL. Loop transfer is indicated by a dotted line 1001 and down-converted noise is indicated by a dot-dashed line 1003. As the figure shows, noise generated at frequencies that normally fall outside the loop bandwidth are folded back into the loop bandwidth due to rectification. This, in turn, modulates the VCO, thereby resulting in excess VCO phase noise. This rectification process has always been present in charge-pump-based phase detectors. It is, however, the use of ΔΣ-modulators that aggravates this problem because ΔΣ-modulators cause a much larger instantaneous phase error (since they shape the fractional-N spurious tones to contain more high-frequency components) than regulator integer-N, or non-ΔΣ-modulator fractional-N, loops. When the frequency synthesizer PLL is used to generator phase or frequency modulation, for example in a GSM transmitter, problems with the error-signal magnitude may be further aggravated.

Figure 11:
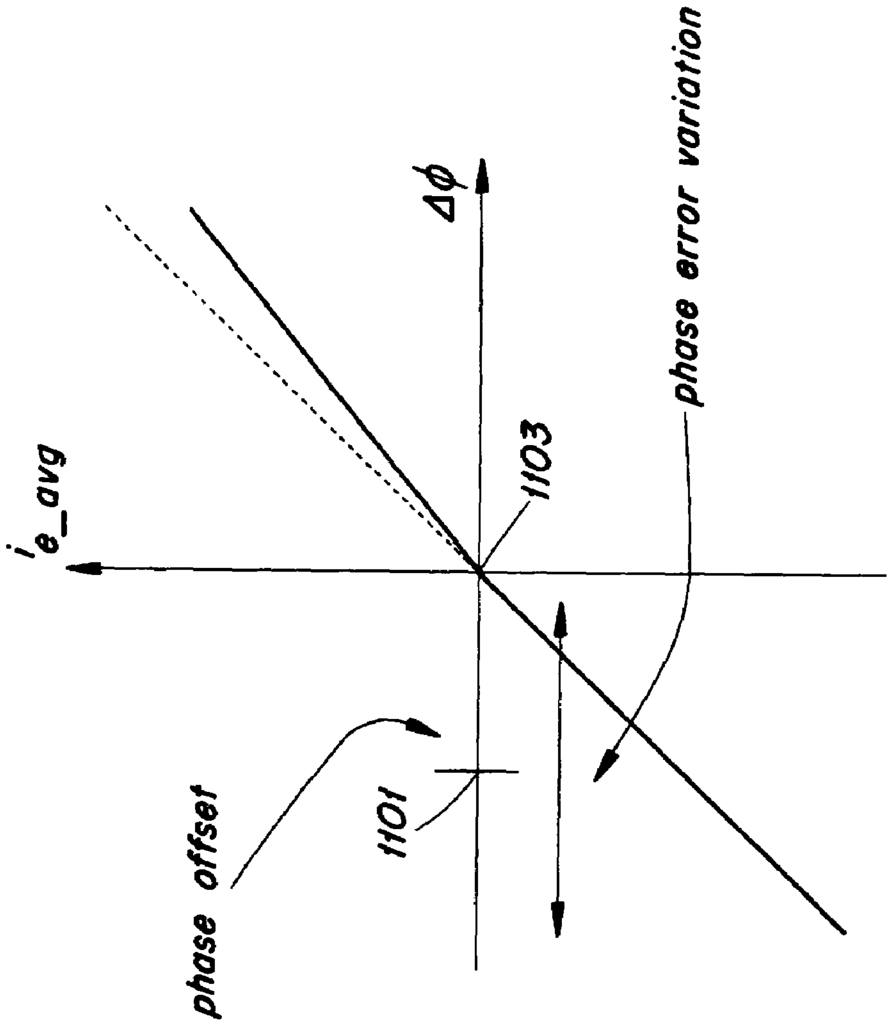
FIG. 11 depicts a graph of a charge-pump transfer function.

The present invention solves the charge-pump asymmetry problem by shifting the operating point of the phase-detector charge pumps so that both positive and negative phase differences will keep the charge-pump operating in a linear region. FIG. 11 depicts a charge-pump transfer function. It can be seen that by shifting the operating point to, for example, a steady state point 1101, the phase error can be made small enough so as not to traverse the nonlinearity at the origin 1103. By staying away from the origin 1103, only one segment of the (mostly) piece-wise linear charge-pump transfer will be active and a much more linear phase-detector response is achieved. When a large error occurs, for example due to a frequency change, the phase detector works in the normal fashion. Only during locked conditions will the operating-point offset be significant.

A phase-detector offset can be implemented in any of a number of alternative ways, and the particular way selected is not essential to the invention. In one embodiment, this is achieved by adding a constant leakage current in the PLL, for example, in the loop filter Z(s). It is, however, desirable to have this leakage current be independent of the loop filter.

In an alternative embodiment, the dead-band delay is shifted so that it acts only on one of the two latch outputs. For example, FIG. 12(*a*) depicts a linear dead-band-free digital phase detector 1200 in which a delay circuit 1201 is interposed between the "up" signal and a first input of the logical AND gate 1203.

Figure 12A:
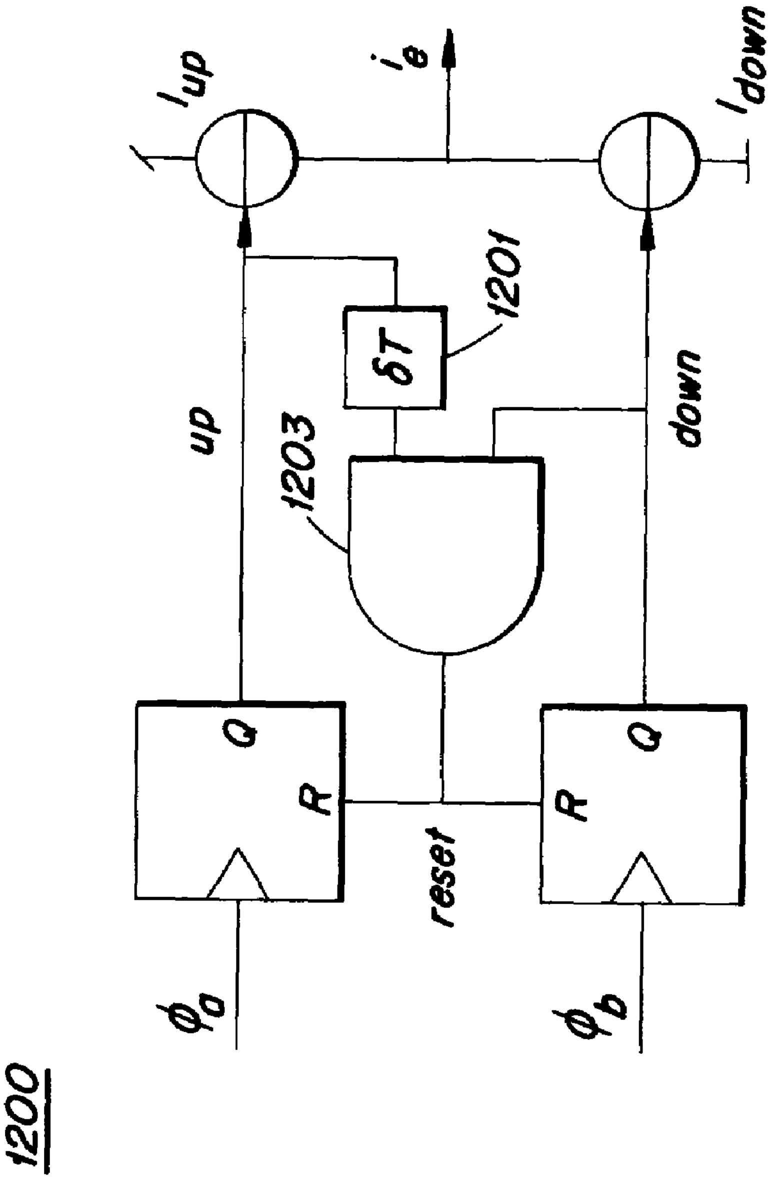
FIG. 12(*a*) depicts a linear dead-band-free digital phase detector in which a delay circuit is placed at the "up" input of the logical AND gate.
Figure 12B:
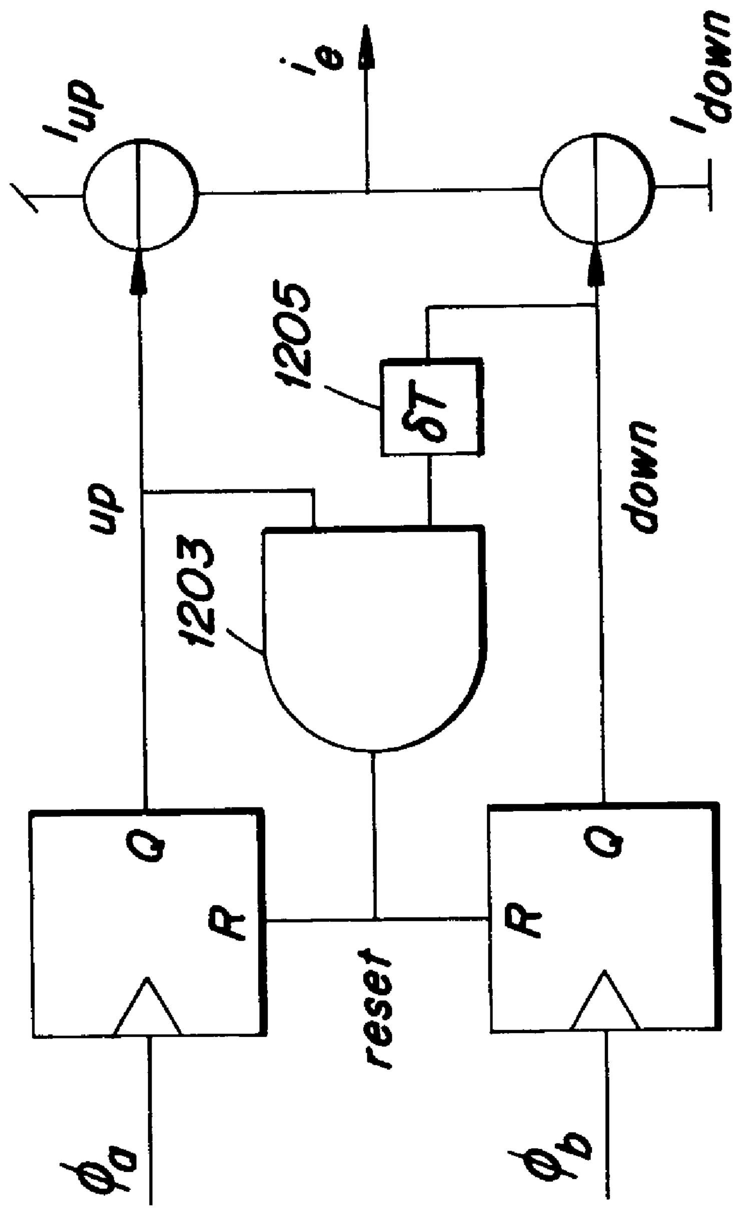
Figure 12C:
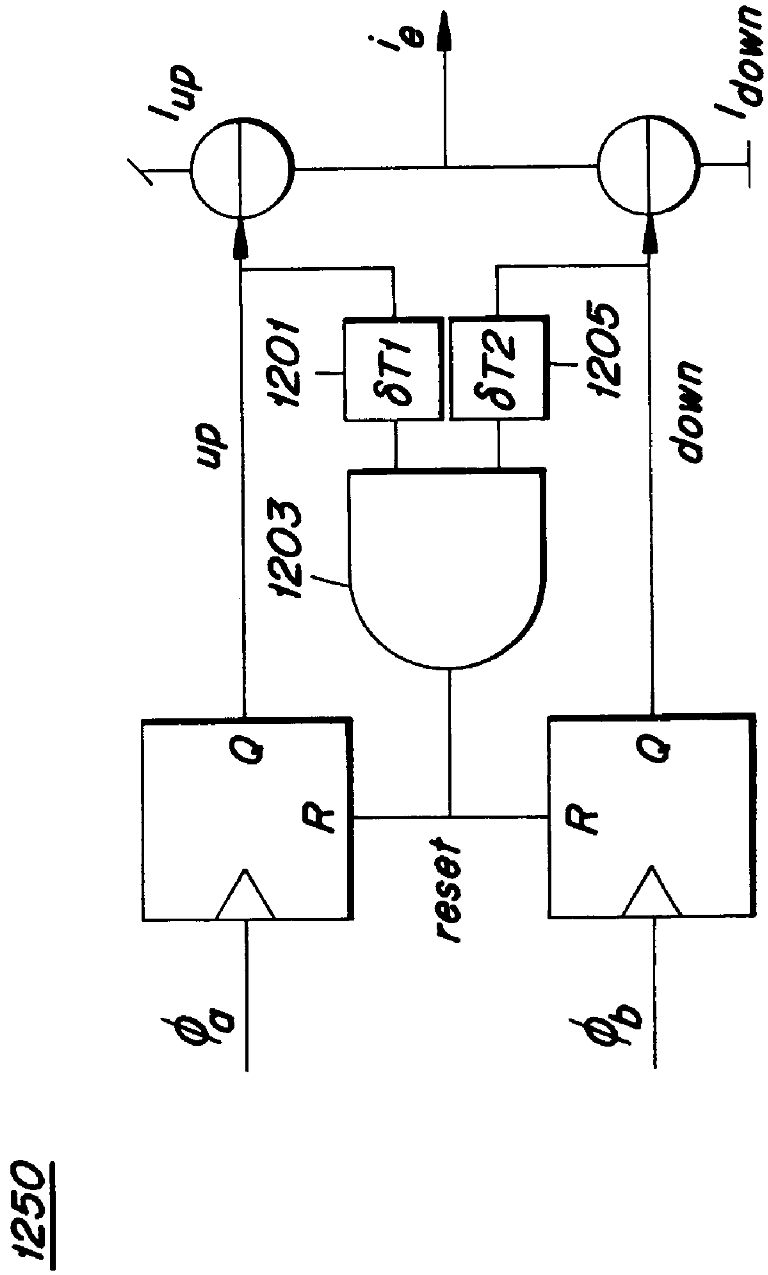

In an alternative embodiment, shown in FIG. 12(*b*), a linear dead-band-free digital phase detector 1225 is arranged such that a delay circuit 1205 is interposed between the "down" signal and a second input of the logical AND gate 1203.

In yet another alternative embodiment, shown in FIG. 12(*c*), a linear dead-band-free digital phase detector 1250 is arranged such that a first delay circuit 1201 is interposed between the "up" signal and the first input of the logical AND gate 1203, and a second delay circuit 1205 is interposed between the "down" signal and the second input of the logical AND gate 1203. In this embodiment, the delay imparted by the first delay circuit 1201 should not be equal to the delay imparted by the second delay circuit 1203.

In each of the alternative embodiments shown in FIGS. 12(*a*), 12(*b*) and 12(*c*), the delay is asymmetric with respect to the "up" and "down" signals supplied to the logical AND gate that generates the reset signal for the phase detector. By letting the delay asymmetry be close to, or larger than, $M/f_o$, (i.e., an amount of time equal to M cycles of the VCO output frequency) all ΔΣ noise will be confined to one side of the phase-detector output-current zero crossing. The delay will cause $f_R$ and $f_o$ to have a constant phase offset corresponding to the delay asymmetry, but this is not a problem in typical frequency synthesizer applications.

The invention has been described with reference to a particular embodiment. However, it will be readily apparent to those skilled in the art that it is possible to embody the invention in specific forms other than those of the preferred embodiment described above. This may be done without departing from the spirit of the invention.

For example, phase-locked loops have been illustrated that employ voltage controlled oscillators. However, those skilled in the art will recognize that this aspect is not essential to the invention, and that the inventive concepts relating to phase detection can also be employed in phase-locked loops that utilize current controlled oscillators instead of voltage controlled oscillators, and that in each case, these components can be considered to be a circuit that generates a phase-locked loop output signal that has a frequency that is controlled by a frequency control signal generated by a loop filter.

Furthermore, the illustrated embodiments described above employ charge pumps, and generate an output current that varies as a substantially linear function of the phase difference between two signals. However, alternative embodiments of the invention can also be devised to generate an output voltage rather than an output current, wherein the output voltage varies as a substantially linear function of the phase difference between the two signals. In such cases, voltage generators rather than charge pumps can be employed. The output voltage can serve as the source signal for controlling a VCO in a phase-locked loop, or the output voltage can alternatively be converted to a varying current for those embodiments that utilize a current controlled oscillator instead of a VCO.

Thus, the preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A fractional-N phase-locked loop, comprising:

a phase detector, comprising:

a first input that receives a first signal;

a second input that receives a second signal; and a comparison circuit that generates a phase detector output signal that is a function of a phase difference between the first signal and the second signal;

a loop filter that generates a frequency control signal from the phase detector output signal, a circuit that generates a phase-locked loop output signal having a frequency that is controlled by the frequency control signal, a frequency divider that generates the second signal from the phase-locked loop output signal, a sigma-delta modulator that generates division values for the frequency divider, and an operating point circuit that maintains an operating point of the phase detector at a position with a nonzero output signal and a corresponding nonzero phase difference between the first and second signals, such that for a predetermined range of both positive and negative phase differences between the first and second signals, the output signal is generated as a substantially linear function of the phase difference between the first signal and the second signal, wherein the substantial linearity of the output signal is due at least in part to a shifting of the operating point so that a nonzero output signal corresponds to a nonzero phase difference between the first and second signals, and the nonzero phase difference is close to or larger than an amount of time equal to at least a number of cycles of the phase-locked loop output signal.

2. The fractional-N phase-locked loop of claim 1, wherein amount of time is such that delta-sigma (ΔΣ) noise is confined to one side of a zero-crossing of the phase detector output signal.

3. The fractional-N phase-locked loop of claim 1, wherein the phase detector output signal is an output current; and wherein the comparison circuit comprises:

a first circuit that asserts a first charge pump control signal in response to an edge of the first signal;

a second circuit that asserts a second charge pump control signal in response to an edge of the second signal;

a first change pump that contributes a positive current to the output current in response to assertion of the first-charge pump control signal;

a second charge pump that contributes a negative current to the output current in response to assertion of the second charge pump control signal; and reset logic that supplies a reset signal to each of the first and second circuits in response to both of the first and second charge pump control signals being asserted, and wherein the operating point circuit comprises:

a delay circuit that delays at least one of the first and second charge pump control signals from being supplied to the reset logic, wherein a length of time that it takes the first charge pump control signal to be supplied to the reset logic is not equal to the length of time that it takes the second charge pump control signal to be supplied to the reset logic.

4. The fractional-N phase-locked loop of claim 3, wherein the delay circuit delays only one of the first and second charge pump control signals from being supplied to the reset logic.

5. The fractional-N phase-locked loop of claim 3, wherein the delay circuit delays both the first and second charge pump control signals from being supplied to the reset logic.

6. The fractional-N phase-locked looped of claim 1, wherein the phase detector output signal is an output voltage; and wherein the comparison circuit comprises:

a first circuit that asserts a first voltage generator control signal in response to an edge of the first signal;

a second circuit that asserts a second voltage generator control signal in response to an edge of the second signal;

a first voltage generator that contributes a positive voltage to the output voltage in response to assertion of the first voltage generator control signal;

a second voltage generator that contributes a negative voltage to the output voltage in response to assertion of the second voltage generator control signal; and reset logic that supplies a reset signal to each of the first and second circuits in response to both of the first and second voltage generator control signals being asserted, and wherein the operating point circuit comprises:

a delay circuit that delays at least one of the first and second voltage generator control signals from being supplied to the reset logic, wherein a length of time that it takes the first voltage generator control signal to be supplied to the reset logic is not equal to the length of time that it takes the second voltage generator control signal to be supplied to the reset logic.

7. The fractional-N phase-locked loop of claim 6, wherein the delay circuit delays only one of the first and second voltage generator control signals from being supplied to the reset logic.

8. The fractional-N phase-locked loop of claim 6, wherein the delay circuit delays both the first and second voltage generator control signals from being supplied to the reset logic.

9. A fractional-N phase-locked loop comprising:

a phase detector that comprises:

a first input that receives a reference clock signal; a second input that receives a feedback signal; and a comparison circuit that generates a phase detector output signal that is a function of a phase difference between the reference clock signal and the feedback signal;

an operating point circuit that maintains an operating point of the phase detector at a position with a nonzero output signal and corresponding nonzero phase difference between the reference clock and feedback signals, such that for a predetermined range of both positive and negative phase differences between the reference clock and feedback signals, the output signal is generated as a substantially linear function of the phase difference between the reference clock and feedback signals, wherein the substantial linearity of the output signal is due at least in part to a shifting of the operating point so that a nonzero output signal corresponds to a nonzero phase difference between the reference clock and feedback signals, and the nonzero phase difference is close to or larger than an amount of time equal to at least a number of cycles of a phase-locked loop output signal;

a loop filter that generates a frequency control signal from the phase detector output signal;

a circuit that generates the phase-locked loop output signal that has a frequency that is controlled by the frequency control signal;

a frequency divider that generates the feedback signal from the phase-locked loop output signal;

a sigma-delta modulator that generates division values for the frequency divider; and one or more circuit elements that leak a predefined portion of at least one of the phase detector output signal and the frequency of the phase-locked loop.

10. The phase-locked loop of claim 9, wherein the one or more circuit elements that leak predefined portion of at least one of the phase detector output signal and the frequency control signal comprise:

one or more circuit elements in the loop filter that leak a predefined portion of the phase detector output signal.

11. The phase-locked loop of claim 9, wherein the circuit that generates the phase-locked loop output signal that has a frequency that is controlled by the frequency control signal is a voltage controlled oscillator.

12. The phase-locked loop of claim 9, wherein the circuit that generates the phase-locked loop output signal that has a frequency that is controlled by the frequency control signal is a current controlled oscillator.

13. A method of generating a fractional-N phase-locked loop output signal, the method comprising:

generating a phase detector output signal that is a function of a phase difference between a first signal and a second signal;

maintaining an operating point at a position with a nonzero output signal and a corresponding nonzero phase difference between the first signal and the second signal, such that for a predetermined range of both positive and negative phase differences between the first and second signals, the output signal is generated as a substantially linear function of the phase difference between the first signal and the second signal, wherein the substantial linearity of the output signal is due at least in a part to a shifting of the operating point so that a nonzero output signal corresponds to a nonzero phase difference between the first and second signals, and the nonzero phase difference is close to or larger than an amount of time equal to at least a number of cycles of the phase-locked loop output signal;

generating a frequency control signal from the phase detector output signal;

generating the phase-locked loop output signal having a frequency that is controlled by the frequency control signal;

using a frequency divider to generate the feedback signal from the phase-locked loop output signal; and using a sigma-delta modulator to generate division values for the frequency divider.

14. The method of claim 13, wherein the amount of time is such that delta-sigma ($\Delta\Sigma$) noise is confined to one side of a zero-crossing of the phase detector output signal.

15. The method of claim 13, wherein the output signal is an output current; and wherein the step of generating the output signal that is a function of the phase difference between the first signal and the second signal comprises:

asserting a first charge pump control signal in response to an edge of the first signal;

asserting a second change pump control signal in response to an edge of the second signal;

contributing a positive current to the output current in response to assertion of the first change pump control signal;

contributing a negative current to the output current in response to assertion of the second charge pump control signal; and deactivating the first and second charge pump control signals in response to both of the first and second charge pump control signals being asserted, and wherein the step of maintaining the operating point of the phase detector comprises:

delaying at least one of the first and second charge pump control signals from affecting the deactivating step, wherein a length of time that it takes the first charge pump control signal to affect the deactivating step is not equal to the length of time that it takes the second charge pump control signal to affect the deactivating step.

16. The method of claim 15, wherein the step of delaying comprises delaying only one of the first and second charge pump control signals from affecting the deactivating step.

17. The method of claim 15, wherein the step of delaying comprises delaying both the first and second charge pump control signals from affecting the deactivating step.

18. The method of claim 13, wherein the output signal is an output voltage; and wherein the step of generating the output signal that is a function of the phase difference between the first signal and the second signal comprises:

asserting a first voltage generator control signal in response to an edge of the first signal;

asserting a second voltage generator control signal in response to an edge of the second signal;

contributing a positive voltage to the output voltage in response to assertion of the first voltage generator control signal;

contributing a negative voltage to the output voltage in response to assertion of the second voltage generator control signal; and deactivating the first and second voltage generator control signals in response to both of the first and second voltage generator control signals being asserted; and wherein the step of maintaining the operating point of the phase detector comprises:

delaying at least one of the first and second voltage generator control signals from affecting the deactivating step, wherein a length of time that it takes the first voltage generator control signal to affect the deactivating step is not equal to the length of time that it takes the second voltage generator control signal to affect the deactivating step.

19. The method of claim 18, wherein the step of delaying comprises delaying only one of the first and second voltages generator control signals from affecting the deactivating step.

20. The method of claim 18, wherein the step of delaying comprises delaying both the first and second voltage generator control signals from affecting the deactivating step.

21. A method of generating a fractional-N phase-locked loop output signal, comprising:

generating a phase detector output signal that is a function of a phase difference between a reference clock signal and a feedback signal;

maintaining an operating point at a position with a nonzero output signal and a corresponding nonzero phase difference between the reference clock signal and the feedback signal, such that for a predetermined range of both positive and negative phase differences between the reference clock and feedback signals, the output signal is generated as a substantially linear function of the phase difference between the reference clock and feedback signals, wherein the substantial linearity of the output signal is due at least in part to a shifting of the operating point so that a nonzero output signal corresponds to a nonzero phase difference between the reference clock and feedback signals, and the nonzero phase difference is closed to or larger than an amount of time equal to at least a number of cycles of the phase-locked loop output signal;

generating a frequency control signal from the phase detector output signal;

generating the phase-locked loop output signal that has a frequency that is controlled by the frequency control signal;

using a frequency divider to generate the feedback signal from the phase locked loop output signal;

using a sigma-delta modulator to generate division values for the frequency divider; and leaking a predetermined portion of at least one of the phase detector output signal and the frequency control signal so as to prevent the leaked signal from influencing the output frequency of the phase-locked loop.

22. The method of claim 21, wherein the step of leaking a predefined portion of at least one of the phase detector output signal and the frequency control signal comprises:

leaking a predefined portion of the phase detector output signal in a loop filter.

* * * * *